United States Patent [19]

Yoshida et al.

[11] Patent Number: 5,100,508

[45] Date of Patent: Mar. 31, 1992

[54] METHOD OF FORMING FINE PATTERNS

[75] Inventors: Yukimasa Yoshida; Isahiro Hasegawa, both of Tokyo, Japan

[73] Assignee: Kabushiki Kaisha Toshiba, Kawasaki, Japan

[21] Appl. No.: 600,765

[22] Filed: Oct. 23, 1990

[30] Foreign Application Priority Data

Oct. 25, 1989 [JP] Japan .................................. 1-276014

[51] Int. Cl.⁵ ........................... B44C 1/22; C23F 1/02
[52] U.S. Cl. .................... 156/659.1; 156/656; 156/661.1; 156/904; 430/312; 430/318
[58] Field of Search ............... 156/651, 656, 659.1, 156/661.1, 904; 430/312, 313, 316, 318, 329, 394; 427/43.1

[56] References Cited

U.S. PATENT DOCUMENTS 3,607,267  9/1971  Garrels ........................... 430/312 X
3,615,463  10/1971  Kuschell ......................... 430/312 X

*Primary Examiner*—William A. Powell
*Attorney, Agent, or Firm*—Foley & Lardner

[57] ABSTRACT

Disclosed is a method of forming a fine pattern composed by repeating, at least once or more, a series of fine pattern forming process having the steps of coating a photoresist on a wafer, exposing a predetermined portion of the wafer through a reticle, carrying out a developing process after the exposure process, etching the wafer, and removing a resist remaining on the wafer, wherein different portions on the wafer are respectively exposed in the exposing process in the series of fine pattern forming process, and each portion once exposed in the process is not exposed again.

5 Claims, 3 Drawing Sheets

DENSITY OF RESIST IN CHIP (%)

U.S. Patent     Mar. 31, 1992     Sheet 3 of 3     5,100,508
FIG.6
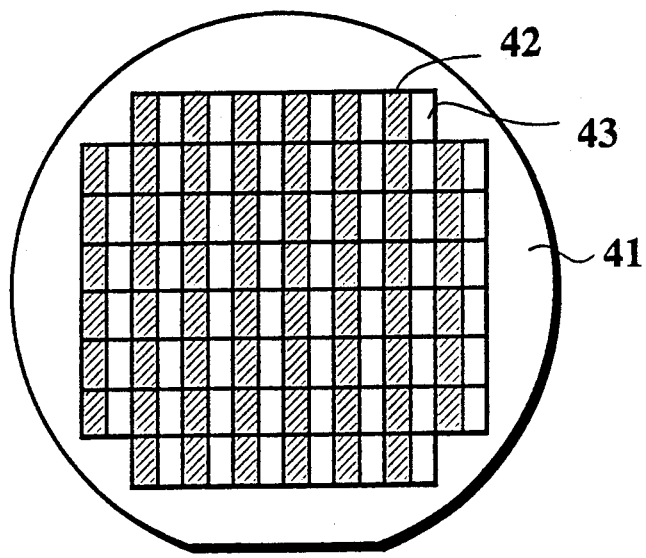
FIG.7A
PRIOR ART
FIG.7B
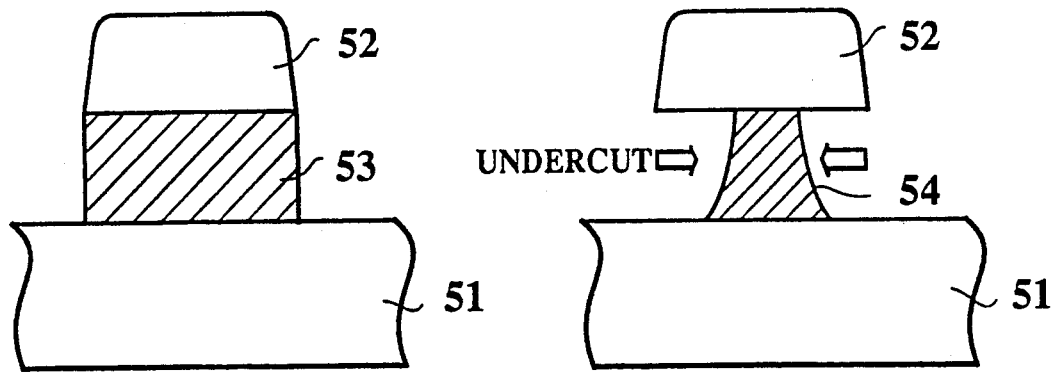

METHOD OF FORMING FINE PATTERNS

BACKGROUND OF THE INVENTION

1. Field of the Invention

The present invention relates to a method of manufacturing a semiconductor device, and particularly to a method of forming fine patterns, such as wiring materials, used for the semiconductor device with high accuracy.

2. Description of the Prior Art

In processing wiring materials of LSI, for example aluminium alloys, a dry etching method using the gas of CI family is generally used. Moreover, to process a fine pattern of the wiring materials on a wafer with high accuracy, the so-called anisotropic etching method is generally used. The anisotropic etching method can be executed by using the effect that a decomposed resist residue attach to the side walls of wiring materials to protect it from the etching treatment. Accordingly, to carry out the anisotropic etching, it is necessary to provide a resist pattern having an area more than a required one on the wafer.

FIG. 1 is a schematic diagram to show a conventional arrangement of exposure pattern on a wafer. In the same drawing, numeral 1 designates a silicon wafer, and 2 denotes an one section or a chip in the exposure patterns. In the prior art, the exposure is repeatedly carried out with respect to each section 2 in the exposure patterns. When the exposure is completed over all the surface of the wafer 1, a development process is carried out, then an etching process is performed.

FIG. 2 is a diagram to show the relation between a resist density in a chip and an amount of undercut of a wiring material in a semiconductor device formed by the exposure pattern using a conventional arrangement method. In the same drawing, the horizontal axis designates the resist density (%) in the chip, and the vertical axis shows the amount of undercut ((a-b) $\mu$m).

From the same drawing, it is seen that when the resist density is smaller than about 20%, the undercut amount is rapidly increased.

In a memory represented by a DRAM, same pattern are frequently repeated in the structure of it. In this case, the resist area occupies more than 40% in the area of the wafer. it therefore becomes possible to manufacture such memories by using the anisotropic etching method.

On the other hand, ASIC (Application Specific Integrated Circuits) foemed for specific uses have recently increased in use and manufacturing. The semiconductor device of this type has often an irregular structural pattern. The area therefore occupied by the resist on a wafer is reduced, and occasionally it becomes less than 10% to that of the wafer. In this case, the etching rate is reduced by the loading effect on manufacturing. Moreover, since the decomposed resist is generated not so sufficiently as to form the protective layers, etching residues and undercut are likely to be generated. It therefore is very difficult to form the fine patterns with high accuracy in manufacturing, moreover the productivity tends to be decreased.

SUMMARY OF THE INVENTION

The object of the present invention is to provide a method of forming a fine pattern with high accuracy even when an area occupied by a resist is relatively small to that over all the surface of a wafer.

To achive the above-mentioned object, a method of forming a fine pattern according to the present invention comprising a series of fine pattern forming processes comprising steps of coating a photoresist on a wafer, exposing a predetermined portion of the wafer through a reticle, carrying out a developing process after the exposure process, etching the wafer, and removing a resist remaining on the wafer, wherein different portions on the wafer are respectively exposed in the exposure process in the series of fine pattern forming process, each once exposed portion in the process is not exposed again, and the series of fine pattern forming process is repeated at least once or more.

In the present invention, the series of fine pattern forming process is repeatedly performed at least one or more, i.e., the resist coating process, exposure process, developing process and etching process many times. In addition, a first exposing step is carried out to expose the wafer on which first exposed portions are arranged in every other one, and a second exposing step is performed to expose the wafer on which second exposed portions are unexposed portion in the first exposing step.

Since the ratio of area occupied by the resist in the series of processes is increased, the generation of undercut in the etching process can be suppressed, so that a fine pattern having a preferably form can be obtained. Accordingly, the productivity can be markedly improved.

These and other objects, feature and advantages of the present invention will be more apparent from the following description of a preferred embodiment, taken in conjunction with the accompanying drawings.

BRIEF DESCRIPTION OF THE DRAWINGS

FIGS. 4, 5 and 6 are schematic diagrams to respectively show exposure patterns in another embodiment of the present invention, FIG. 7A is a diagram to show a form of a wiring material obtained by a method of forming a fine pattern in the present invention, and FIG. 7B is a diagram to show a form of a wiring material obtained by a conventional method of forming a fine pattern.

DETAILED DESCRIPTION OF THE EMBODIMENTS

Hereinafter, the present invention will be explained with reference to the drawings.

Figure 1:
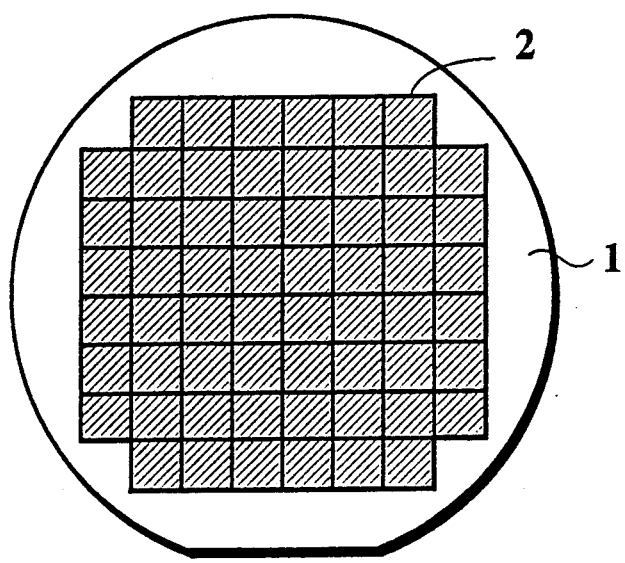
FIG. 1 is a schematic diagram of a conventional exposure pattern in a semiconductor manufacturing process.
Figure 2:
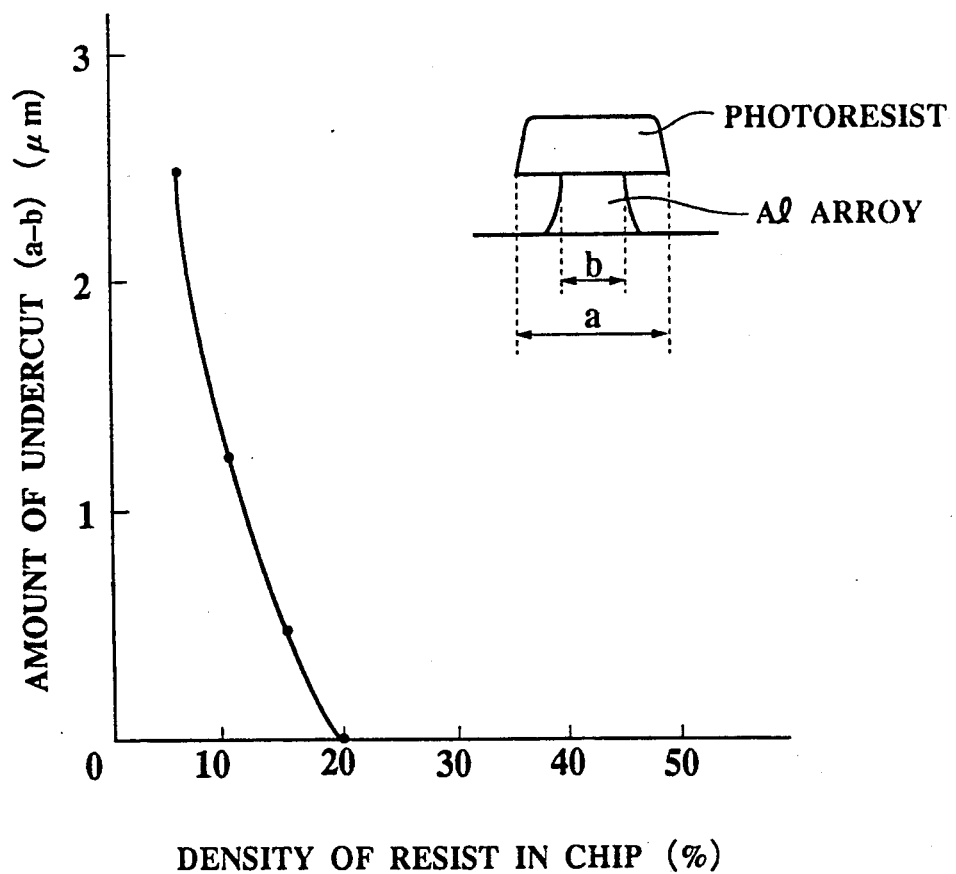
FIG. 2 is a diagram to show the relation between a resist density and an amount of undercut.
Figure 3A:
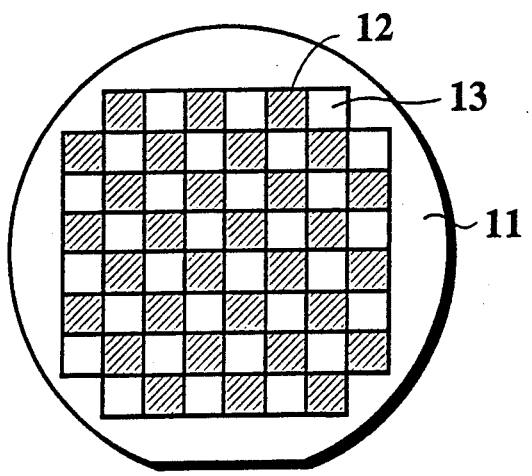
FIGS. 3A and 3B are schematic diagrams to respectively show exposure patterns in an embodiment of the present invention.
Figure 3B:
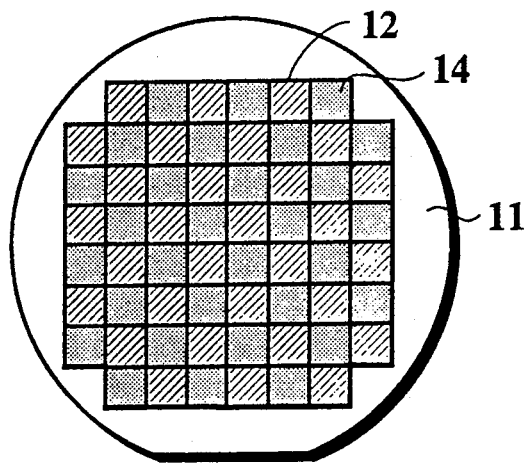

FIGS. 3A and 3B are diagrams of exposure patterns of a wafer in the first embodiment of the present invention. In the same drawings, reference numeral 11 shows a silicon wafer, 12 designated by oblique lines shows each portion (each chip) to be exposed on a first exposure process, 13 denotes each portion (each chip) not exposed on the first exposure process but exposed on a second exposure process to be an exposed portion 14.

Next, the method of forming a fine pattern of the present invention is described. First, a silicon wafer 11 is prepared, and a resist is coated on the wafer 11 by a predetermined process (First Coating Process).

Then, as shown in FIG. 3A, exposure is carried out so as to form exposed portions in a chequered pattern in which the exposed portions are so arranged as not to be in contact with next ones respectively (First Exposure Process). As the result, exposed portions 12 and nonexposure portions 13 are respectively formed in chequered patterns. In this case, the rate of area occupied by the resist becomes 50% or more.

Next, a developing process is given to the silicon wafer having been subjected to the exposure process (First Developing Process), moreover the wafer is subjected to an etching process (First etching process).

Subsequently, the resist is removed (Removal Process), and a resist is coated on the silicon wafer 11 again (Second Coating Process).

Then, the nonexposure portions 13 are exposed so as to change them into exposed potions 14 as shown in FIG. 3B (Second Exposure Process). Thereafter the wafer 11 is processed similarly to the first processes through a second developing process, etching process and resist removal process so as to form a fine pattern.

According to the method of forming the fine pattern of the first embodiment, fine wirings can be formed with high accuracy on the wafer 11 without causing undercut as shown in FIG. 7A.

Namely, in the same drawings, FIG. 7A shows a cross section of wiring formed by the method of this embodiment, while FIG. 7B shows a cross section of wiring obtained by a conventional method. Incidentally, reference numeral 51 denotes a semiconductor substrate, 52 designates a resist, and 53 is a wiring material.

As shown in the same drawings, the wiring material 53 of this embodiment is etched in a preferable form without generating undercut.

Figure 4:
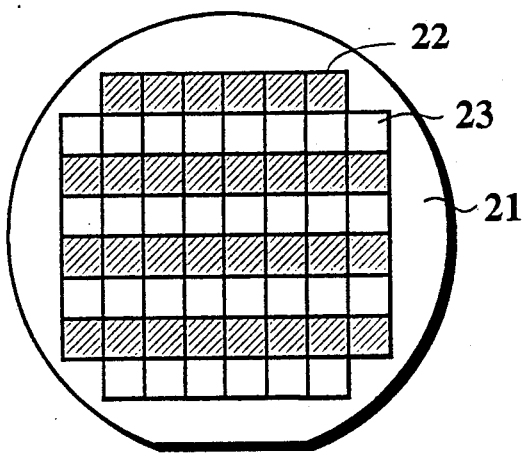

In the first embodiment, the exposure process is given to the wafer so as to form a chequered pattern. However, it is also possible to carry out the exposure process to form such an exposure pattern as shown in FIG. 4. In the exposure pattern, light exposure is given to every other line consisting of chips 22 in the first exposure process. Then, the remaining lines of chips 23 are exposed in the second exposure process.

Figure 5:
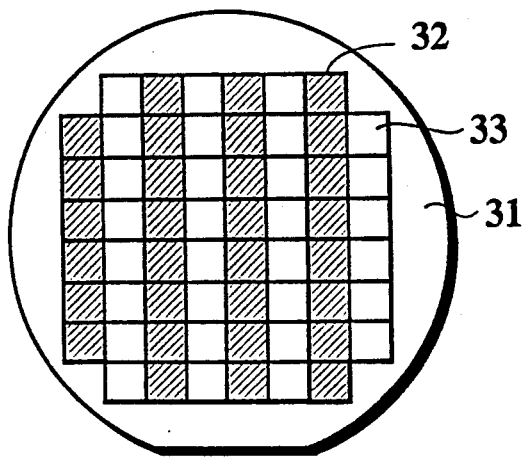

Moreover, it is also possible to carry out the exposure process to form such an exposure pattern as shown in FIG. 5. In the exposure pattern, exposure is given to every other row consisting of chips 32 in the first exposure process, then the remaining rows 33 of chips 31 not exposed in the first exposure process are exposed in the second.

Furthermore, it is also possible to make the pitch of exposure larger than that of chips in the pattern so as to increase area of resist not exposed.

By the way, when the exposure pattern is a reticle composed of a plurality of chips, the method of forming a fine pattern according to this embodiment can be applied by providing portions not temporarily exposed between these chips.

For example, when the reticle is a two-chip reticle, it is possible to form the portions not temporarily exposed on a silicon wafer by carrying out the first exposure process so as to form suitable spaces not exposed between the respective chips.

FIG. 6 is a diagram to show an exposure pattern for a case where the two-chip reticle is used in the exposure process. In the same drawing, reference numeral 41 shows a silicon wafer, 42 is each exposure portion, and 43 is each space between two chips. In this case, the number of chips included in the patten on the wafer 41 is reduced becaused of the spaces 43. Conversely, the area occupied by the resist is increased. The productivity of the fine pattern therefore can be improved without causing the undercut.

In the embodiments shown in FIGS. 3A, 3B through 6, the rate of the resist area is substantially improved by repeating twice the series of processes comprising the resist coating process, exposure process, etching process and resist removal process.

However, the present invention is not limited to the above embodiments, and it is possible to repeat the series of processes more than twice.

Particularly, in the embodiment shown in FIG. 6, since the number of chips provided on the silicon wafer is reduced when the portions not temporarily exposed is increased, it is necessary to decide the most suitable condition from the relation between the number of chips per silicon wafer and the productivity.

Various modification will become possible of those skilled in the art after receiving the teachings of the present disclosure without departing form the scope thereof.

What is claimed is:

1. A method of forming a fine pattern, comprising:
   a series of fine pattern forming process comprising:
   a step of coating a photoresist on a wafer;
   a step of exposing a predetermined portion of the wafer through a reticle;
   a step of carrying out a developing process after the exposing step;
   a step of etching the wafer; and
   a step of removing a resist remaining on the wafer,
   wherein different portions on the wafer are respectively exposed in the exposure process in the series of fine pattern forming process, each portion once exposed in the process is not exposed again, and the series of fine pattern forming process is repeated at least once or more.

2. A method of forming a fine pattern according to claim 1, wherein in the series of fine pattern forming process, a first exposing step is carried out to expose first exposed portions which are arranged in every other one on the wafer, then
   a second exposing step is carried out to expose second portions which are not exposed in the first exposing step on the wafer.

3. A method of forming a fine pattern according to claim 1, wherein
   a first step of exposing is carried out to every other row of chips on the wafer, then
   a second step of exposing is carried out to expose portions on the wafer not exposed in the first step of exposing process.

4. A method of forming a fine pattern according to claim 1, wherein
   a first step of exposing is carried out to every other line of chips on the wafer, then
   a second step of exposing is carried out to expose portions on the wafer not exposed in the first exposure process.

5. A method of forming a fine pattern according to claim 1, wherein
   the step of exposing is carried out by using a reticle composed of a plurality of chips between which portions not exposed in the first step of exposing are respectively interposed.

* * * * *